United States Patent
Reusch et al.

(10) Patent No.: US 10,454,050 B2
(45) Date of Patent: Oct. 22, 2019

(54) ORGANIC LIGHT-EMITTING DEVICE

(71) Applicant: OSRAM Opto Semiconductors GmbH, Regensburg (DE)

(72) Inventors: Thilo Reusch, Donaustauf (DE); Daniel Steffen Setz, Böblingen (DE)

(73) Assignee: OSRAM OLED GMBH, Regensburg (DE)

(*) Notice: Subject to any disclaimer, the term of this patent is extended or adjusted under 35 U.S.C. 154(b) by 304 days.

(21) Appl. No.: 14/383,506

(22) PCT Filed: Mar. 1, 2013

(86) PCT No.: PCT/EP2013/054205
§ 371 (c)(1),
(2) Date: Sep. 5, 2014

(87) PCT Pub. No.: WO2013/131829
PCT Pub. Date: Sep. 12, 2013

(65) Prior Publication Data
US 2015/0034930 A1 Feb. 5, 2015

(30) Foreign Application Priority Data
Mar. 7, 2012 (DE) .......... 10 2012 203 583

(51) Int. Cl.
*H01L 51/50* (2006.01)
*H01L 51/52* (2006.01)

(52) U.S. Cl.
CPC ...... *H01L 51/5012* (2013.01); *H01L 51/5215* (2013.01); *H01L 51/5218* (2013.01); *H01L 51/5234* (2013.01)

(58) Field of Classification Search
CPC ...... H01L 51/50; H01L 51/52; H01L 51/5004
(Continued)

(56) References Cited

U.S. PATENT DOCUMENTS

2004/0051444 A1* 3/2004 Schaepkens ........ H01L 27/3283
313/504
2007/0063628 A1 3/2007 Cok et al.
(Continued)

FOREIGN PATENT DOCUMENTS

DE 102009037185 A1 12/2010
DE 102010054893 A1 6/2012
(Continued)

OTHER PUBLICATIONS

Frischeisen, J. et al.: "Increased light outcoupling efficiency in dye-doped small molecule organic light-emitting diodes with horizontally oriented emitters," Organic Electronics, 2011, vol. 12, pp. 809-817). (Year: 2011).*

(Continued)

*Primary Examiner* — Jamie C Niesz
(74) *Attorney, Agent, or Firm* — McDermott Will & Emery LLP

(57) ABSTRACT

An organic light-emitting component is specified, comprising a translucent substrate (1), on which a translucent electrode (3) is arranged, comprising on the translucent electrode (3) an organic functional layer stack comprising organic functional layers having at least one organic light-emitting layer (5) and comprising a further electrode (7), wherein the at least one organic light-emitting layer (5) comprises emitter molecules having an anisotropic molecular structure which are oriented anisotropically, and wherein all the organic light-emitting layers (5, 51, 52, 53) of the organic light-emitting component are at a distance of greater than or equal to 20 nm and less than or equal to 100 nm from the further electrode (7).

10 Claims, 2 Drawing Sheets

Figure 1A:
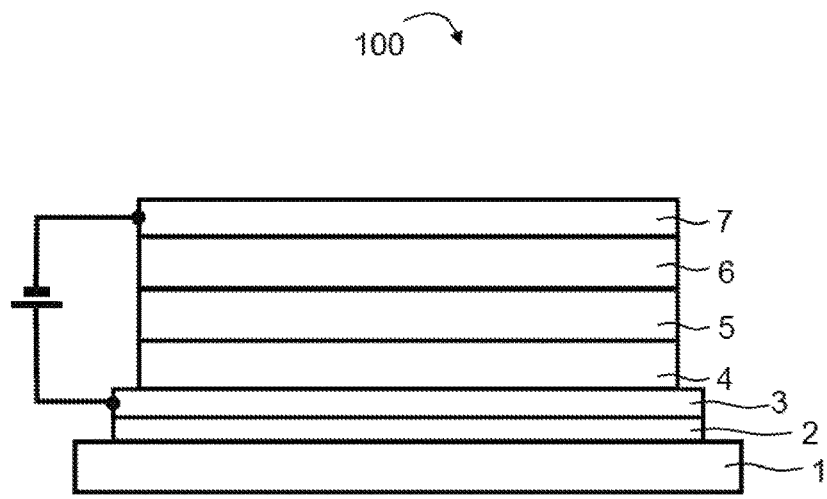

(58) Field of Classification Search
USPC .......................................................... 257/40
See application file for complete search history.

(56) References Cited

U.S. PATENT DOCUMENTS

| | | | |
|---|---|---|---|
| 2007/0257608 | A1 | 11/2007 | Tyan et al. |
| 2008/0165811 | A1* | 7/2008 | Stein ..................... H01S 5/0425 372/22 |
| 2009/0026931 | A1* | 1/2009 | Xu ....................... H01L 51/0059 313/504 |
| 2010/0044685 | A1* | 2/2010 | Kim ..................... H01L 27/3272 257/40 |
| 2012/0286258 | A1* | 11/2012 | Naraoka ................ C09K 11/06 257/40 |

FOREIGN PATENT DOCUMENTS

| | | |
|---|---|---|
| DE | 102011086255 A1 | 5/2013 |
| DE | 102011086277 A1 | 5/2013 |
| JP | 11102783 A | 4/1999 |
| JP | 2006277987 A | 10/2006 |
| JP | WO 2011/132773 * | 10/2011 ............. H05B 33/02 |
| WO | 2011/132773 A1 | 10/2011 |
| WO | WO-2011132773 A1 * | 10/2011 ............. C09K 11/06 |

OTHER PUBLICATIONS

Do, Y. et al: "Enhanced Light Extraction from Organic Light-Emitting Diodes with 2D SiO2/SiNx Photonic Crystals", Advanced Materials, Jul. 17, 2003, vol. 15, No. 14, pp. 1214-1218.

Frischeisen, J. et al.: "Increased light outcoupling efficiency in dye-doped small molecule organic light-emitting diodes with horizontally oriented emitters", Organic Electronics, 2011, vol. 12, pp. 809-817.

Sun, Y. et al.: "Enhanced light out-coupling of organic light-emitting devices using embedded low-index grids", Nature Photonics, Aug. 2008, vol. 2, pp. 483-487.

Ziebarth, J.M. et al.: "Extracting Light from Polymer Light-Emitting Diodes Using Stamped Bragg Gratings", Advanced Functional Materials, May 2004, vol. 14, No. 5, pp. 451-456.

* cited by examiner

ORGANIC LIGHT-EMITTING DEVICE

An organic light-emitting device is described.

In organic light-emitting diodes (OLEDs) only part of the generated light is outcoupled directly. The rest of the light generated in the active region is distributed among various loss channels, for instance in light which is guided in the substrate, in a transparent electrode and in organic layers by wave guidance effects, and in surface plasmons, which may be generated in a metallic electrode. The wave guidance effects arise in particular through the refractive index differences at the interfaces between the individual layers and regions of an OLED. With known OLEDs, typically only around a quarter of the light generated in the active region is outcoupled into the surrounding environment, i.e. for example the air, while around 25% of the generated light is lost to emission by wave guidance in the substrate, around 20% of the generated light by wave guidance in a transparent electrode and the organic layers and around 30% through the generation of surface plasmons in a metallic electrode. The light guided in the loss channels cannot be outcoupled from an OLED in particular without additional technical measures.

To increase light outcoupling and thus emitted light output, measures are known, for example for outcoupling the light guided in a substrate into emitted light. For this, for example films containing scattering particles or films with surface patterns such as for instance microlenses are used on the outer face of the substrate. It is also known to provide direct patterning of the outer face of the substrate or to introduce scattering particles into the substrate. Some of these approaches, for example the use of scattering films, are already used commercially and may be scaled up with regard to the emission surface in particular in OLEDS which take the form of lighting modules. However, these approaches to light outcoupling have the significant disadvantages that outcoupling efficiency is limited to around 60 to 70% of the light guided in the substrate and that the appearance of the OLED is affected substantially, since the applied layers or films produce a milky, diffusely reflective surface.

Approaches are also known which involve outcoupling light guided in organic layers or in a transparent electrode. However, these approaches have not so far gained commercial acceptance in OLED products. For example, the document Y. Sun, S. R. Forrest, Nature Photonics 2, 483 (2008) proposes forming "low-index grids", wherein patterned regions with a material of low refractive index are applied to a transparent electrode. It is moreover also known to apply high refractive index scattering regions under a transparent electrode in a polymer matrix, as described for example in document US 2007/0257608. Herein, the polymer matrix generally has a refractive index in the range of n=1.5 and is applied by a wet chemical method. Furthermore, "Bragg gratings" or photonic crystals with periodic scattering patterns with pattern sizes in the wavelength range of the light are also known, as described for example in documents Ziebarth et al., Adv. Funct. Mat. 14, 451 (2004) and Do et al., Adv. Mat. 15, 1214 (2003).

However, using such measures, the proportion of the light generated in the active region of an OLED which is turned into plasmons cannot be influenced or even outcoupled.

It is at least one object of specific embodiments to provide an organic light-emitting device with at least one organic light-emitting layer which has improved efficiency and light outcoupling.

This object is achieved by subject matter according to the independent claim. Advantageous embodiments and further developments of the subject matter are characterised in the dependent claims and are revealed, moreover, by the following description and drawings.

According to at least one embodiment, an organic light-emitting device on a substrate has a translucent electrode and a further electrode between which is arranged an organic functional layer stack. The further electrode may particularly preferably be of reflective construction. Alternatively, it may also be possible for the further electrode to be constructed to be at least partially translucent.

For the purposes of the present invention, a first layer which is arranged or applied "on" a second layer may mean that the first layer is arranged or applied directly on the second layer in direct mechanical and/or electrical contact. Furthermore, indirect contact is also possible, in which further layers are arranged between the first layer and second layer.

"Translucent" is used here and hereinafter to describe a layer which is transmissive to visible light. The translucent layer may here be transparent, i.e. clear, or at least partially light-scattering and/or partially light-absorptive, such that the translucent layer may for example also be diffusely or milkily translucent. A layer here described as translucent may particularly preferably be maximally transparent, such that in particular light absorption is as low as possible.

According to a further embodiment, the organic functional layer stack has at least one or more organic light-emitting layers. In other words, the at least one organic light-emitting layer may comprise a plurality of organic light-emitting layers. The at least one or the plurality of organic light-emitting layers are arranged between two charge carrier-conducting layers, one of which is configured as a hole-conducting layer and the other as an electron-conducting layer. For example, an organic hole-conducting layer may be arranged on the translucent electrode, with the at least one organic light-emitting layer thereabove and an organic electron-conducting layer above that. Alternatively, the organic functional layer stack may also have a structure which is inverted in terms of polarity, that is to say that in this case, when viewed from the translucent electrode, an organic electron-conducting layer is arranged under the at least one organic light-emitting layer and an organic hole-conducting layer is arranged above the at least one organic light-emitting layer.

If the organic functional layer stack has a plurality of organic light-emitting layers, further charge carrier-conducting layers, in particular in each case an electron-conducting layer and a hole-conducting layer, may be arranged between adjacent organic light-emitting layers. Adjacent organic light-emitting layers may thereby in particular be connected in series. Such a combination of adjacent electron- and hole-conducting layers, between which an undoped layer functioning as a charge carrier-generating zone may additionally also be arranged, may also be described as a "charge-generation layer" (CGL).

According to a further particularly preferred embodiment, the substrate is translucent and the translucent electrode is arranged between the translucent substrate and the organic functional stack, such that light generated in the at least one organic light-emitting layer may be emitted through the translucent electrode and the translucent substrate. Such an organic light-emitting device may also be described as a "bottom emitter". For example, the substrate may comprise one or more materials in the form of a layer, a plate, a film or a laminate, which are selected from glass, quartz or plastic. The substrate particularly preferably comprises or consists of glass, for example in the form of a glass layer, glass film or glass sheet.

According to a further particularly preferred embodiment, the at least one organic light-emitting layer comprises or the plurality of organic light-emitting layers comprise emitter molecules with an anisotropic molecular structure which are anisotropically oriented.

An anisotropic molecular structure is understood here and hereinafter to mean that the molecules used do not form a substantially spherical molecular structure, but instead more of an elongate molecular structure. To achieve this, emitter molecules of anisotropic molecular structure in particular comprise at least two different ligands, for example ligands which differ in terms of their atoms coordinating to a central atom, or comprise a square-planar central atom environment.

In a further particularly preferred embodiment, the emitter molecules of the at least one or of the plurality of organic light-emitting layers are oriented substantially parallel, in particular parallel to the plane of extension of the at least one or the plurality of organic light-emitting layers. This may mean, in particular, that the anisotropic emitter molecules as described further below comprise transition dipole moments, hereinafter also denoted as dipole moments for short, which are arranged parallel or substantially parallel to the plane of extension of the at least one organic light-emitting layer. "Substantially parallel" may in particular mean that the emitter molecules and in particular their dipole moments are oriented in a proportion of more than $2/3$, i.e. more than around 66%, parallel to the main plane of extension of the at least one organic light-emitting layer. Hereinafter, an orientation of "more than 66%" may designate an orientation of more than $2/3$ and an orientation of "less than 33%" an orientation of less than $1/3$.

In the case of an anisotropic and in particular a substantially parallel arrangement of the emitter molecules and in particular their dipole moments, losses caused by plasmon excitations in the further, preferably reflective, electrode may be suppressed to a considerable extent, such that a loss of efficiency of the at least one organic light-emitting layer due to plasmon excitation may thus be avoided at least in part, whereby ultimately the overall efficiency of the organic light-emitting component may increase markedly. Accordingly, through suppression of the plasmon excitation by the at least one or the plurality of organic light-emitting layers, the proportion of the generated radiant power or of the generated light from the organic light-emitting layer(s) which is guided in the organic layers and/or the translucent electrode by wave guidance effects may be increased. In contrast to plasmons, this proportion may be outcoupled at least in part out of the organic light-emitting device with the aid of an optical outcoupling layer, as described further below, such that it is possible with the organic light-emitting device described here to increase the light output emitted by the substrate in comparison with known OLEDs with typically isotropically and non-directionally arranged emitter molecules.

According to a further particularly preferred embodiment, the at least one organic light-emitting layer is at a distance of greater than or equal to 20 nm and less than or equal to 100 nm from the further, preferably reflective, electrode. This may mean in particular that the organic functional layers of the organic functional layer stack arranged between the at least one organic light-emitting layer and the further electrode have a total thickness of greater than or equal to 20 nm and less than or equal to 100 nm.

If the organic functional layer stack has a plurality of organic light-emitting layers, all the light-emitting layers are at a distance of greater than or equal to 20 nm and less than or equal to 100 nm from the further, preferably reflective, electrode.

According to a further embodiment, the optical length between the further, preferably reflective, electrode and at least one organic light-emitting layer or between the further, preferably reflective, electrode and each of the plurality of organic light-emitting layers for a wavelength of 600 nm is greater than or equal to 1.6 times 20 nm and less than or equal to 1.8 times 100 nm. The values 1.6 and 1.8 here correspond to a range of preferred refractive index values for the organic functional layers.

Furthermore, the distance between the at least one organic light-emitting layer or each of the plurality of organic light-emitting layers and the further, preferably reflective, electrode may be less than or equal to 70 nm.

The inventors have noted that the distance described here between the at least one or the plurality of organic light-emitting layers and the further electrode enables more efficient light generation due to microcavity effects, for example due to the "Purcell effect" known to a person skilled in the art, wherein furthermore the still present plasmon loss channels are suppressed by the above-described anisotropic and in particular parallel arrangement of the emitter molecules.

Furthermore, the small distance described here between the at least one or the plurality of light-emitting layers and the further electrode results in an organic light-emitting device which has a small total thickness compared with known OLEDs. In the case of known OLEDs, due to the greater thickness of the organic functional layer stack the transparency and in particular also the doping requirements of the organic functional layers between the light-emitting layer and further electrode increase such that sufficient conductivity is still ensured with a relatively large thickness. In the case of the organic light-emitting device described here, it is possible because, as described above, the at least one light-emitting layer comprises anisotropic emitter molecules with an anisotropic orientation, for only low plasmon excitation to occur in the further electrode and the "saved" proportion of the plasmons to be subdivided evenly over the other loss channels and thus to be available for efficient outcoupling, both without and also for instance with the aid of the optical outcoupling layer described below.

The inventors have noted that the further embodiments and features described hereinafter may have an effect on the efficiency and light outcoupling of the organic light-emitting device described here with the previously described embodiments and features and in particular the above-described at least one light-emitting layer, such that the embodiments and features described here may in particular also be understood as construction rules for a particularly efficient layer architecture for the organic light-emitting device, which may in particular also be distinguished by their advantageous interaction.

According to a further embodiment, an optical outcoupling layer is arranged on the side of the translucent electrode remote from the at least one organic light-emitting layer. In particular, the optical outcoupling layer may be applied to the substrate. Furthermore, the translucent electrode may be arranged on the optical outcoupling layer. The optical outcoupling layer may in particular be suitable and intended for "internal outcoupling", i.e. for reducing that part of the radiant power generated in the at least one organic light-emitting layer or of the light generated there which is guided in organic layers and/or in the translucent electrode. Particularly preferably, the optical outcoupling layer may comprise a material which has a refractive index greater than or equal to 1.6. In particular, it may be advantageous for the refractive index of the optical outcoupling layer to be greater than or equal to 1.8 and particularly preferably greater than or equal to 1.85. It is particularly advantageous for the optical outcoupling layer to have a refractive index which is greater than or equal to a layer thickness-weighted average refractive index of the organic functional layers and of translucent electrode.

The optical outcoupling layer may for example comprise a "high refractive index" glass, i.e. a glass with a refractive index of greater than or equal to 1.8 and particularly preferably greater than or equal 1.85, for example with a refractive index of 1.9.

Furthermore, it is also possible for the optical outcoupling layer to comprise an organic material, in particular a polymer-based material, which may for example be applied to the substrate by a wet chemical method. For example, the optical outcoupling layer may to this end comprise one or more of the following materials: polycarbonate (PC), polyethylene naphthalate (PEN), polyethylene terephthalate (PET), polyurethane (PU), polyacrylate, for example polymethyl methacrylate (PMMA) or epoxide.

According to a further embodiment, the optical outcoupling layer scatters light. To this end, the optical outcoupling layer comprises scattering centres for example, which are arranged distributed in one of the above-stated materials. The above-stated materials to this end form a matrix material in which the scattering centres are embedded. The scattering centres may be formed by regions and/or particles with a higher or lower refractive index than the matrix material. For example, the scattering centres may be formed by particles, for example $SiO_2$, $TiO_2$, $ZrO_2$, $Al_2O_3$, or by pores, which may for example be air-filled.

Furthermore, it is also possible for the translucent substrate to be configured as an optical outcoupling layer and to have one or more of the above-stated features.

According to a further embodiment, the translucent electrode has a refractive index which is conformed to the refractive index of the organic layers and preferably corresponds to the layer thickness-weighted mean of the refractive indices of the organic layers. The translucent electrode may in particular have a refractive index of greater than or equal to 1.6 and particularly preferably of greater than or equal to 1.7. A refractive index for the translucent electrode in a range of greater than or equal to 1.7 and less than or equal to 2.1 has also proven particularly advantageous.

According to a further embodiment, the translucent electrode has low absorption, in particular in a spectral range of greater than 450 nm, for example in a visible spectral range of between 450 nm and 640 nm. Particularly preferably, the translucent electrode in such a spectral range has an absorbance coefficient k of less than or equal to 0.005. In particular, the total transmission of the translucent electrode in the visible spectral range should be no less than 80% and thus should be greater than or equal to 80%.

According to a further embodiment, the translucent electrode takes the form of an anode and may thus serve as hole-injecting material. The further electrode is then configured as a cathode. Alternatively, the translucent electrode may also take the form of a cathode and thus serve as an electron-injecting material. The further electrode is then configured as an anode. Configuration of the translucent electrode and further electrode as anode or cathode depends in particular on the above-described structure of the organic functional layer stack.

The translucent electrode may for example comprise a transparent conductive oxide or consist of a transparent conductive oxide. Transparent conductive oxides ("TCO" for short) are transparent, conductive materials, generally metal oxides, such as for example zinc oxide, tin oxide, cadmium oxide, titanium oxide, indium oxide or indium tin oxide (ITO). In addition to binary metal-oxygen compounds, such as for example ZnO, $SnO_2$ or $In_2O_3$, ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may be also p- or n-doped.

According to a further preferred embodiment, the translucent electrode comprises or consists of ITO. In particular, the translucent electrode may here have a thickness of greater than or equal to 50 nm and less than or equal to 200 nm. In such a thickness range transmission in the visible spectral range of the translucent electrode is greater than or equal to 80% and the specific resistance ρ is in a range of approximately 150 to 500 μΩ·cm.

If the further electrode is translucent or at least partly translucent, it may comprise one or more features described in relation to the translucent electrode.

According to a further embodiment, the further electrode is reflective and comprises a metal which may be selected from aluminium, barium, indium, silver, gold, magnesium, calcium and lithium as well as compounds, combinations and alloys. In particular, the further reflective electrode may comprise Ag, Al or alloys therewith, for example Ag:Mg, Ag:Ca, Mg:Al. Alternatively or in addition, the further reflective electrode may also comprise one of the above-stated TCO materials.

Furthermore, it is also possible for the further reflective electrode to comprise at least two or more layers and to be configured as a "bi-layer" or "multi-layer" electrode. For example, the further reflective electrode may to this end comprise, facing the organic layers, an Ag layer with a thickness of greater than or equal to 30 nm and less than or equal to 50 nm, on which an aluminium layer is applied. It is also possible for the further reflective electrode to comprise, as an alternative to metal-metal layer combinations or metal-multilayer combinations, one or more TCO layers combined with at least one metal layer. For example, the further reflective electrode may comprise a combination of a TCO layer and a silver layer. It is also possible, for example, for a metal layer to be arranged between two TCO layers. In such embodiments, one of the layers or a plurality of layers may also be configured as nucleation layers.

Furthermore, it is also possible for the further reflective electrode to comprise further optical adaptation layers for adjusting reflectivity or the reflected spectral range. Such optical adaptation layers may be advantageous in particular in the case of layers emitting monochromatic light or organic light-emitting devices emitting monochromatic light. An optical adaptation layer should to this end advantageously be conductive and may for example comprise one or more TCO layers which are arranged one above the other in a Bragg mirror-like arrangement.

Particularly preferably, the further reflective electrode has a reflectivity of greater than or equal to 80% in the visible spectral range.

The further reflective electrode may for example be produced by means of a physical vapour deposition (PVD) method and/or by means of sputtering.

The organic functional layers between the translucent electrode and further electrode may comprise organic polymers, organic oligomers, organic monomers, organic small, non-polymeric molecules or low molecular weight compounds ("small molecules") or combinations thereof.

According to a further embodiment, one or more charge carrier-conducting layers, i.e. electron- and/or hole-conducting layers, comprise a dopant. The dopant advantageously brings about an increase in conductivity, in order to keep the operating voltage of the organic light-emitting component low.

The inventors have furthermore noted that it is particularly advantageous for the organic layers of the organic functional layer stack, in particular those which have a thickness greater than or equal to 5 nm, to have an absorbance coefficient k of less than or equal to 0.005 in one part of the visible spectral range, i.e. for wavelengths of greater than 450 nm. In particular, this also applies to a hole-conducting layer which may for example comprise a hole-transport layer with a thickness of up to 350 nm.

According to a further embodiment, a hole-conducting layer comprises at least one hole-injection layer, one hole-transport layer or a combination of these. In particular, both doped layers of molecular compounds and electrically conductive polymers may be considered as hole-transport or hole-injection layers. Materials which may prove advantageous in particular for a hole-transport layer are for example tertiary amines, carbazole derivatives, conductive polyaniline or polyethylenedioxythiophene. Furthermore, the following materials may for example be suitable:

NPB (N,N'-bis(naphth-1-yl)-N,N'-bis(phenyl)benzidine, β-NPB (N,N'-bis-(naphth-2-yl)-N,N'-bis-(phenyl)benzidine), TPD (N,N'-bis-(3-methylphenyl)-N,N'-bis-(phenyl)benzidine), N,N'-bis(naphth-1-yl)-N,N'-bis(phenyl)-2,2-dimethylbenzidine, DMFL-TPD (N,N'-bis(3-methylphenyl)-N,N'-bis(phenyl)-9,9-dimethylfluorene, DMFL-NPB (N,N'-bis(naphth-1-yl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), TAPC (di-[4-(N,N-di-tolylamino)-phenyl]cyclohexane), PAPB (N,N'-bis (phenanthren-9-yl)-N,N'-bis(phenyl)benzidine), TNB (N,N,N',N'-tetranaphth-2-yl-benzidine), TiOPC (titanium oxide phthalocyanine), CuPC (copper phthalocyanine), F4-TCNQ (2,3,5,6-tetrafluoro-7,7,8,8-tetracyanoquinodimethane), PPDN (pyrazino[2,3-f][1,10]phenanthroline-2,3-dicarbonitrile), MeO-TPD (N,N,N',N'-tetrakis(4-methoxyphenyl)benzidine), β-NPP (N,N'-di(naphth-2-yl)-N,N'-diphenylbenzene-1,4-diamine), NTNPB (N,N'-diphenyl-N,N'-di-[4-(N,N-di-tolylamino)phenyl]-benzidine) and NPNPB (N,N'-diphenyl-N,N'-di-[4-(N,N-diphenylamino)phenyl] benzidine), 1,4-bis(2-phenylpyrimidin-5-yl)benzene (BPPyP), 1,4-bis(2-methylpyrimidin-5-yl)benzene (BMPyP), 1,4-di(1,10-phenanthrolin-3-yl)benzene (BBCP), 2,5-di(pyridin-4-yl)pyrimidine (DPyPy), 1,4-bis(2-(pyridin-4-yl)pyrimidin-5-yl)benzene (BPyPyP), 2,2',6,6'-tetraphenyl-4,4'-bipyridine (GBPy), 1,4-di(benzo[h]quinolin-3-yl) benzene (PBAPA), 2,3,5,6-tetraphenyl-4,4'-bipyridine (TPPyPy), 1,4-bis(2,3,5,6-tetraphenylpyridin-4-yl)benzene (BTPPyP), 1,4-bis(2,6-tetrapyridinylpyridin-4-yl)benzene (BDPyPyP) or mixtures of the above-stated substances.

A metal oxide, an organometallic compound, an organic material or a mixture thereof may for example here be used as dopant, for example $WO_3$, $MoO_3$, $V_2O_5$, $Re_2O_7$ and $Re_2O_5$, dirhodium tetra(trifluoroacetate) $(Rh_2(TFA)_4)$ or the isoelectronic ruthenium compound $Ru_2(TFA)_2(CO)_2$ or an organic material which comprises aromatic functional groups or is an aromatic organic material, for example aromatic materials with a significant number of fluorine and/or cyanide (CN) substituents.

Low molecular weight compounds may in particular be applied by vacuum thermal evaporation (VTE) or physical vapour deposition (PVD) or from the liquid phase. Polymeric materials may for example be applied from the liquid phase or be formed by linking low molecular weight starting materials on the surface of the translucent electrode. Likewise, a combination of the two approaches is possible, in which a thin layer of a p-doped hole-injection layer with a thickness of 10 to 20 nm is applied by vapour deposition to a hole-injection layer applied using a liquid method.

The hole-conducting layer typically has a refractive index of greater than or equal to 1.6 and particularly preferably in a range of greater than or equal to 1.6 and less than or equal to 1.9.

According to a further embodiment, an electron-conducting layer comprises at least one electron-injection layer, one electron-transport layer or a combination of these. For the electron-conducting layer, the following materials may for example be suitable: PBD (2-(4-biphenylyl)-5-(4-tert-butylphenyl)-1,3,4-oxadiazole), BCP (2,9-dimethyl-4,7-diphenyl-1,10-phenanthroline), BPhen (4,7-diphenyl-1,10-phenanthroline), TAZ (3-(4-biphenylyl)-4-phenyl-5-tert-butylphenyl)-1,2,4-triazole), Bpy-OXD (1,3-bis[2-(2,2'-bipyrid-6-yl)-1,3,4-oxadiazol-5-yl]benzene), BP-OXD-Bpy (6,6'-bis[5-(biphenyl-4-yl)-1,3,4-oxadiazol-2-yl]-2,2'-bipyridyl), PADN (2-phenyl-9,10-di(naphth-2-yl)-anthracene), Bpy-FOXD (2,7-bis[2-(2,2'-bipyrid-6-yl)-1,3,4-oxadiazol-5-yl]-9,9-dimethylfluorene), OXD-7 (1,3-bis[2-(4-tert-butylphenyl)-1,3,4-oxadiazol-5-yl]benzene), HNBphen (2-(naphth-2-yl)-4,7-diphenyl-1,10-phenanthroline), NBphen (2,9-bis(naphth-2-yl)-4,7-diphenyl-1,10-phenanthroline), and 2-NPIP (1-methyl-2-(4-(naphth-2-yl)phenyl)-1H-imidazole[4,5-f][1,10]phenanthroline) and mixtures of the above-stated substances.

An alkali metal, an alkali metal salt, an alkaline earth metal salt, an organometallic compound, a molecular doping or a mixture thereof may for example here be used as dopant, for example Li, $Cs_3PO_4$, $Cs_2CO_3$, a metallocene, i.e. an organometallic compound with a metal M and two cyclopentadienyl residues (Cp) in the form $M(Cp)_2$, or a metal-hydropyrimidopyrimidine complex. The metal may for example comprise or be tungsten, molybdenum and/or chromium.

For example, an electron-conducting layer may comprise an electron-transport layer which for example comprises 2,9-dimethyl-4,7-diphenyl-1,10-phenanthroline (BCP) or 4,7-diphenyl-1,10-phenanthroline (BPhen). This material may preferably comprise a dopant which is selected from Li, $Cs_2CO_3$, $Cs_3PO_4$ or a molecular doping. In addition to the organic hole-conducting layer and to the organic electron-conducting layer, between which the at least one organic light-emitting layer or the plurality of organic light-emitting layers is/are arranged, one or more further organic layers may be present in the organic functional layer stack. In particular, a hole-blocking layer may for example be arranged between an electron-conducting layer and an organic light-emitting layer. It is also possible for an electron-blocking layer to be arranged between a hole-conducting layer and an organic light-emitting layer.

According to a further embodiment, the at least one organic light-emitting layer comprises an electroluminescent material as emitter molecules with an anisotropic molecular structure. Suitable materials for this purpose are anisotropic emitter materials which display fluorescence- or phosphorescence-based radiation emission.

According to a further embodiment, the at least one organic light-emitting layer comprises a phosphorescent emitter material with an anisotropic molecular structure which is selected from iridium complexes, platinum complexes and palladium complexes or from mixtures thereof. In particular, the iridium complexes produce very good quantum yields, if they are used as emitter molecules in organic light-emitting apparatuses. Furthermore, platinum and palladium complexes also deliver very good results, since these may be deposited very easily in molecular arrangements oriented substantially parallel to one another and to the substrate surface due to the usually square-planar coordination in the presence of an appropriate matrix material. In general, however, the phosphorescent emitters are not restricted to these metal complexes, but instead other metal complexes, such as lanthanoid complexes, for example europium complexes, or indeed gold, rhenium, rhodium, ruthenium, osmium or zinc complexes, are in principle also suitable.

In particular, the following compounds which have an emission maximum in the blue, green or red spectral range may be considered as emitter materials for the at least one organic light-emitting layer: $Ir(ppy)_2(acac)=(bis(2-phenylpyridine)$ (acetylacetonate)iridium(II)), $Ir(mPPy)_2(acac)=(bis[2-(p-tolyl)pyridine](acetylacetonate)$ iridium(III)), bis[1-(9,9-dimethyl-9H-fluoren-2-yl)-isoquinoline](acetylacetonate)iridium(III), $Ir(mdq)_2(acac)=(bis(2-methyldibenzo[f,h]-quinoxaline)-$ (acetylacetonate)iridium(III)), iridium(III)-bis(dibenzo[f,h]-quinoxaline) (acetylacetonate), $Ir(btp)_2(acac)=(bis(2-benzo[b]thiophen-2-yl-pyridine)(acetylacetonate)iridium$ (III)), $Ir(piq)_2(acac)=(bis(1-phenylisoquinoline)$ (acetylacetonate)iridium(III)), $Ir(fliq)_2(acac)-1=(bis[1-(9,9-dimethyl-9H-fluoren-2-yl)-isoquinoline](acetylacetonate)$ iridium(III)), Hex-$Ir(phq)_2(acac)=bis[2-(4-n-hexylphenyl)$ quinoline]-(acetylacetonate)iridium(III), $Ir(flq)_2(acac)-2=$ (bis[3-(9,9-dimethyl-9H-fluoren-2-yl)-isoquinoline] (acetylacetonate)iridium(III)), bis[2-(9,9-dibutylfluorenyl)-1-isoquinoline](acetylacetonate)iridium(III), bis[2-(9,9-dihexylfluorenyl)-1-pyridine](acetylacetonate)iridium(III), $(fbi)_2Ir(acac)=bis(2-(9,9-diethylfluoren-2-yl)-1-phenyl-1H-benzo[d]imidazolato)$ (acetylacetonate)iridium(III), Ir(2-phq)$_2$(acac) (bis(2-phenylquinoline) (acetylacetonate)-iridium(III)), iridium(III)-bis(2-(2'-benzothienyl)pyridinato-N,C3') (acetylacetonate), $Ir(BT)_2(acac)=bis(2-phenylbenzothiazolate)-(acetylacetonate)iridium(III)$, (PQ)$_2$Ir(dpm)=bis(2-phenylquinoline) (2,2,6,6-tetramethylheptane-3,5-dionate)iridium(III), $(Piq)_2Ir(dpm)$ =bis(phenylisoquinoline) (2,2,6,6-tetramethylheptane-3,5-dionate) iridium(III) and iridium(III)bis(4-phenylthieno[3,2-c]pyridinato-N,C2')acetylacetonate and mixtures of the above-stated substances. As an alternative to the listed complexes with iridium, these may also comprise another, above-stated metal, for example platinum, palladium or a lanthanoid. For emitter materials which emit in the blue wavelength range, carbene complexes of iridium are possible examples.

To produce the at least one organic light-emitting layer, the emitter molecules with the anisotropic molecular structure may be applied for example under thermodynamic control, wherein the emitter material is evaporated for example together with a matrix material under a vacuum and deposited onto a charge carrier-conducting layer, i.e. an electron- or hole-conducting layer depending on the arrangement of the functional layers of the organic functional layer stack. The anisotropic orientation of the emitter molecules of the at least one organic light-emitting layer may proceed by thermodynamic control.

Application under thermodynamic control is here and hereinafter understood to mean that, during deposition of the emitter molecules and optionally also of the molecules of the matrix material, the deposited molecules are not arbitrarily oriented, but are instead oriented at least in part in a preferential direction. Accordingly, the transition dipole moments of the emitter molecules also overall comprise an anisotropic distribution within the at least one organic light-emitting layer, which is distinguished in particular in that more than 66% of the transition dipole moments of the emission process, which is a dipole transition, are oriented parallel to the layer plane of the at least one organic light-emitting layer and thus fewer than 33% of the transition dipole moments are oriented in non-parallel, thus for example orthogonal, manner. In thermodynamic control, during deposition or in a subsequent step the molecules enter into an interaction with their environment, i.e. for example other molecules, such that reorientation and orientation may proceed in which a thermodynamically more favourable configuration can be adopted. Such an anisotropic orientation of the emitter molecules of the at least one organic light-emitting layer is possible in particular when starting materials which have an anisotropic molecular structure are selected both for the emitter molecules and for a matrix material, into which the emitter molecules are embedded in the at least one organic light-emitting layer.

Thermodynamic control may for example be made possible by a growth rate which is comparatively low, for example less than or equal to 0.5 nm/s, in particular less than or equal to 0.2 nm/s or even less than 0.1 nm/s, for example less than 0.05 nm/s or even less than 0.025 nm/s. The growth rate is understood to mean the rate at which the at least one organic light-emitting layer is deposited. Furthermore, the thermodynamic control may additionally or alternatively also be achieved by heat treatment during application or after application, in which the at least one organic light-emitting layer is brought to or maintained at a temperature higher than room temperature. The at least one organic light-emitting layer may for example be brought to a temperature of between 30° C. and 100° C., wherein the selected temperatures must not bring about any damage to the layers of the device yet to be or already applied.

After application and optionally heat treatment, the emitter molecules with the anisotropic molecular structure are frozen in their oriented orientation. Selection of the emitter molecules and optionally of the molecules of a matrix material may thus in particular proceed such that, at room temperature, reorientation of the emitter molecules, for example by isomerisation of ligands of the emitter molecules, can no longer proceed.

As an alternative to thermodynamic control, it is for example also possible to use "kinetic control" to "freeze" the emitter molecules in the position in which they each initially enter into interaction with the surface on which they are deposited.

According to a further embodiment, the at least one organic light-emitting layer comprises a matrix material in which the emitter molecules with the anisotropic molecular structure are embedded or contained.

According to a further embodiment, the matrix material may also have an anisotropic molecular structure. An anisotropic orientation of the emitter molecules may additionally be assisted by means of such matrix materials. As with the anisotropic emitter molecules, it is also the case for the matrix material with an anisotropic molecular structure that here in particular no substantially symmetrically substituted points of attachment may be present.

In particular, a matrix material with anisotropic molecular structure is understood to mean a material in which, starting from a central branch point, in particular a central atom or a central ring, no instances of three, four or more substituents with identical or substantially identical structure are present, wherein only substituents other than hydrogen are taken into consideration. An identical structure here means that the substituents are identical. A substantially identical structure means furthermore that the at least three substituents may differ in terms of the molecular weight attributable thereto, but none of the substituents of the branch point has a molecular weight which is at least 50% below one of the other substituents, wherein only substituents other than hydrogen are taken into consideration. Accordingly, molecules with anisotropic molecular structure are not highly symmetrical molecules with more than two identical substituents or they comprise very different substituents at branch points with three or more substituents, for example branch points such as tertiary amine nitrogen atoms or at least tri-substituted benzene rings.

According to a further embodiment, the matrix material may have hole-conducting and/or electron-conducting properties. In particular, the matrix material may comprise or consist of one or more of the compounds mentioned in relation to the hole-conducting and electron-conducting layers.

The at least one or the plurality of organic light-emitting layers may particularly preferably each emit visible light in a narrow or wide wavelength range, i.e. monochromatic or polychromatic or indeed for example white light. The at least one or the plurality of organic light-emitting layers may to this end comprise one or more organic light-emitting materials. Polychromatic or white light may be generated by a combination of different organic light-emitting materials in the at least one organic light-emitting layer or indeed by a combination of the emitter material in a plurality of organic light-emitting layers. For example, one of several light-emitting layers may emit red and green light, while another light-emitting layer emits blue light. Alternatively, in the case of a plurality of organic light-emitting layers it is also possible for example for at least two or indeed all the light-emitting layers to generate white light.

An encapsulation arrangement may moreover also be arranged over the electrodes and the organic layers.

The encapsulation arrangement may for example take the form of a glass cover or, preferably, the form of a thin-film encapsulation.

A glass cover, for example in the form of a glass substrate with a cavity, may be adhesively bonded to the substrate by means of an adhesive layer. A moisture-absorbing substance (getter), for example comprising zeolite, may furthermore be adhesively bonded in the cavity, to bind moisture or oxygen which may penetrate through the adhesive.

An encapsulation arrangement configured as a thin-film encapsulation is here understood to mean a device which is suitable for forming a barrier against atmospheric substances, in particular against moisture and oxygen and/or against further harmful substances such as for instance corrosive gases, for example hydrogen sulfide. The encapsulation arrangement may to this end comprise one or more layers each with a thickness of less than or equal to a few 100 nm.

In particular, the thin-film encapsulation may comprise or consist of thin layers which are applied for example by means of an atomic layer deposition (ALD) method. Suitable materials for the layers of the encapsulation arrangement are for example aluminium oxide, zinc oxide, zirconium oxide, titanium oxide, hafnium oxide, lanthanum oxide or tantalum oxide. The encapsulation arrangement preferably comprises a layer sequence with a plurality of the thin layers which each comprise a thickness of between one atom layer and 10 nm, limit values included.

As an alternative or in addition to thin layers produced by ALD, the encapsulation arrangement may comprise at least one or a plurality of further layers, i.e. in particular barrier layers and/or passivation layers, which are deposited by thermal vapour deposition or by a plasma-enhanced process, for instance sputtering or plasma-enhanced chemical vapour deposition (PECVD). Suitable materials for this purpose may be the above-stated materials together with silicon nitride, silicon oxide, silicon oxynitride, indium tin oxide, indium zinc oxide, aluminium-doped zinc oxide, aluminium oxide and mixtures and alloys of the stated materials. The one or the plurality of further layers may for example each have a thickness of between 1 nm and 5 µm and preferably between 1 nm and 400 nm, limit values included.

Figure 1B:
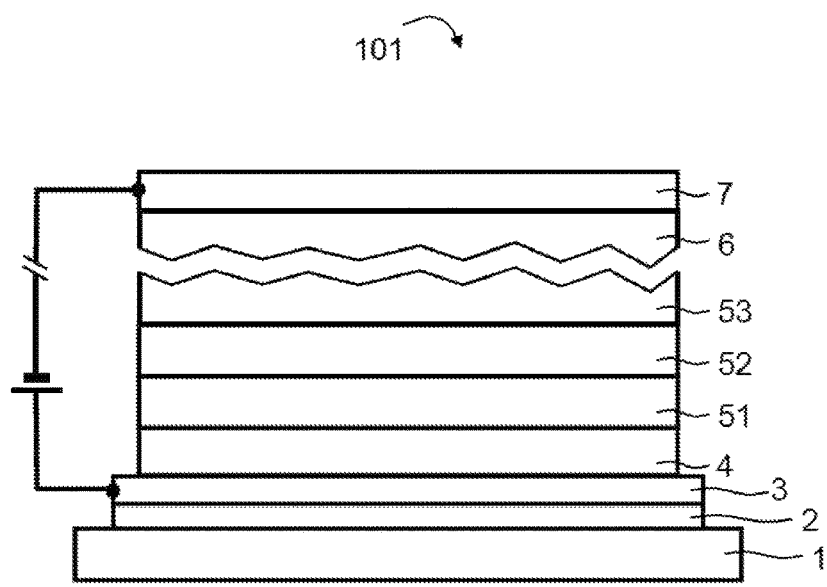
Figure 2:
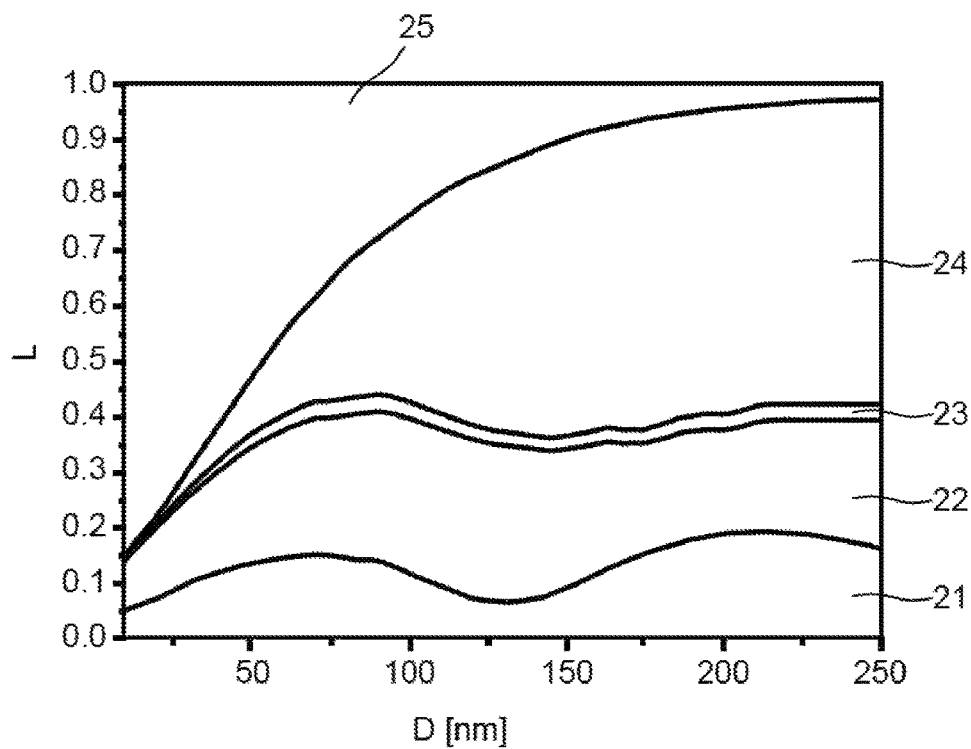
Figure 3:
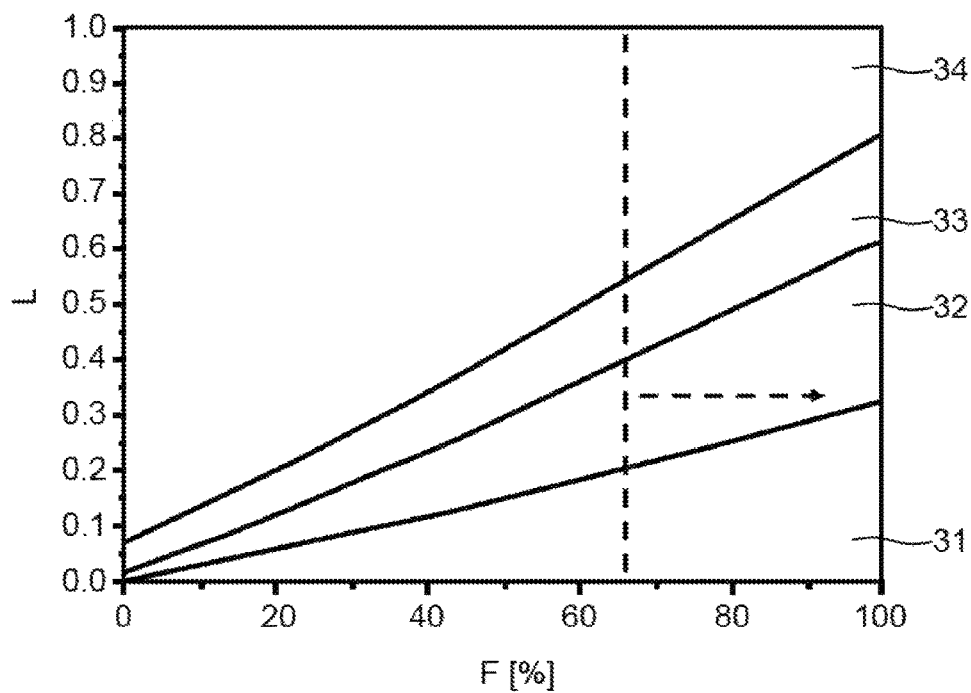

Furthermore, in particular in the case of an optical outcoupling layer formed of a polymer, it may be possible for an encapsulation arrangement formed as a thin-film encapsulation to be formed thereon under the translucent electrode. In particular in the case of a non-hermetically sealed optical outcoupling layer, the organic light-emitting device may be sealed and encapsulated in this way from below, i.e. underneath the translucent electrode. Further advantages, advantageous embodiments and further developments are revealed by the following exemplary embodiments described below in conjunction with the Figures, in which:

FIG. 1A is a schematic representation of an organic light-emitting device according to one exemplary embodiment, FIG. 1B is a schematic representation of an organic light-emitting device according to a further exemplary embodiment, FIG. 2 is a schematic representation of relative proportions of outcoupling and loss channels of the radiant power generated in the active layer of a conventional OLED and FIG. 3 is a schematic representation of relative proportions of outcoupling and loss channels of the radiant power generated in an organic light-emitting layer depending on the proportion of the parallel oriented emitter molecules.

In the exemplary embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

FIG. 1A shows an exemplary embodiment of an organic light-emitting device 100. This comprises a substrate 1, on which a translucent electrode 3 and a further electrode 7 are applied. Between the electrodes 3, 7 an organic functional layer stack is arranged with organic functional layers with an organic light-emitting layer 5.

The organic light-emitting device is configured as a "bottom emitter" and to this end comprises a translucent substrate 1 of glass. Alternatively, the substrate 1 may also comprise or consist of another translucent material, for example a plastic or a glass-plastic laminate. In the exemplary embodiment shown, the further electrode 7 is configured as a reflective electrode. Alternatively, the further electrode 7 may also be configured to be at least in part translucent, such that the organic light-emitting device 100 may in this case be configured to be emit bidirectionally, i.e. bilaterally.

Furthermore, an optical outcoupling layer 2 is arranged between the translucent substrate 1 and the translucent electrode 3. The optical outcoupling layer 2 serves to increase the proportion outcoupled from the device 100 of the light generated in the organic light-emitting layer 5 and has a refractive index for effective light outcoupling which is preferably greater than or equal to a layer thickness-weighted average refractive index of the organic functional layers and translucent electrode 3. In the exemplary embodiment shown, the optical outcoupling layer 2 to this end comprises a glass, in particular a high refractive index glass with a refractive index of approximately 1.9. Alternatively, the optical outcoupling layer 2 may also be based on a polymer material, as described above in the general part of the description.

Furthermore, the outcoupling layer 2 comprises scattering centres distributed in the glass material in the form of particles or pores with a higher or lower refractive index than the glass material. In the case of pores these may for example be air-filled, while $SiO_2$, $TiO_2$, $ZrO_2$ and/or $Al_2O_3$ may for example be used as particles. The optical outcoupling layer 2 may ensure that, as described above in the general part of the description, at least part of the light wave-guided in the translucent electrode 3 or in the organic layers may be outcoupled from the organic light-emitting device 100 by the substrate 1.

Alternatively, it is also possible for example for the substrate 1 to be configured as an outcoupling layer and have features as described above and/or bring about light scattering by a non-periodic boundary surface structure.

Furthermore, an encapsulation arrangement, which is not shown for clarity's sake, may be arranged above the electrodes 3, 7 and the organic layers. The encapsulation arrangement may for example take the form of a glass cover or, preferably, the form of a thin-film encapsulation, as described above in the general part of the description. Furthermore, it may be necessary, in particular in the case of an optical outcoupling layer 2 comprising a polymer, for an encapsulation arrangement formed as a thin-film encapsulation also to be provided thereon under the translucent electrode 3, as described above in the general part of the description.

The translucent electrode 3 has a refractive index of greater than or equal to 1.6 and preferably of greater than or equal to 1.7 and less than or equal to 2.1. Furthermore, thicknesses and material of the translucent electrode 3 are selected such that the extinction coefficient in a visible spectral range of 450 nm to 640 nm is less than or equal to 0.005. In particular, transmission of the translucent electrodes 3 in the visible spectral range is greater than or equal to 80%.

In the exemplary embodiment shown, the translucent electrode is to this end of indium tin oxide (ITO) with a thickness of greater than or equal to 50 nm and less than or equal to 200 nm. In this way, it is also possible to ensure that the specific resistance of the translucent electrode 3 lies in a range greater than or equal to 150 and less than or equal to 500 μΩ·cm, whereby a sufficiently high conductivity can be ensured for the translucent electrode 3.

In the exemplary embodiment shown, the reflective further electrode 7 is of metal and in particular comprises Ag, Al or alloys such as Ag:Mg, Ag:Ca or Mg:Al. Alternatively, it also possible for the further reflective electrode 7 to comprise at least two or more metal layers or one or more TCO layers in combination with one or more metal layers. For example, the further electrode 7 may also comprise optical adaptation layers, for example consisting of a TCO layer stack with a Bragg mirror-like configuration, in order to adapt the reflectivity of the reflective further electrode 7 to the emission spectrum of the light-emitting layer 5. The further reflective electrode 7 preferably has a reflectivity of greater than or equal to 80% in the visible spectral range.

Alternatively, the translucent electrode 3 and/or the further electrode 7 may each case also comprise another material described above in the general part of the description.

In the exemplary embodiment shown, the translucent electrode 3 is configured as an anode and the further electrode 7 as a cathode. In accordance with the consequently predetermined polarity of the organic light-emitting device 100, the organic light-emitting layer 5 is arranged between a hole-conducting layer 4 on the side of the translucent electrode 3 and an electron-conducting layer 6 above the organic light-emitting layer 5.

As an alternative to the polarity of the organic light-emitting device 100 shown in the exemplary embodiment of FIG. 1, said device may also have a polarity inverted in relation thereto, with the translucent electrode 3 configured as a cathode and the further electrode 7 as an anode and the arrangement of the hole-conducting layer 4 and electron-conducting layers 6 reversed.

The hole-conducting layer 4 comprises at least one hole-transport layer. Furthermore, the hole-conducting layer 4 may additionally comprise a hole-injection layer, which may have a thickness in the range of a few tens of nanometers.

Both the hole-transport and the hole-injection layer of the hole-conducting layer 4 as well as the electron-conducting layer 6 may consist of the materials described above in the general part of the description, for example of low molecular weight compounds ("small molecules") or of polymers.

In addition to the layers shown in FIG. 1, still further organic layers, for example an electron- or hole-blocking layer, may be present between the charge carrier-conducting layers 4, 6 and the organic light-emitting layer 5.

It is particularly advantageous for those organic layers of the organic functional layer stack which have a thickness of greater than or equal to 5 nm to have an absorbance coefficient k of less than or equal to 0.005 in part of the visible spectral range, i.e. for wavelengths of greater than 450 nm. For example, the thickness of the hole-conducting layer 4 and in particular the thickness of the hole-transport layer may preferably be greater than or equal to 5 nm and less than or equal to 350 nm, while the hole-conducting layer 4 has an absorbance coefficient k of less than or equal to 0.005 at least for part of the visible spectral range.

The organic light-emitting layer 5 comprises at least one organic material which, when the organic light-emitting device 100 is in operation as indicated by the schematically indicated interconnection of the electrodes 3 and 7, emits light in a visible wavelength range.

The organic light-emitting layer 5 is at a distance of greater than or equal to 20 nm and less than or equal to 100 nm from the further electrode 7. This may mean in particular that the organic functional layers of the organic functional layer stack arranged between the organic light-emitting layer 5 and the further electrode 7 have a total thickness of greater than or equal to 20 nm and less than or equal to 100 nm. In particular, this distance may be produced substantially by the total thickness of the electron-conducting layer 6 arranged in the exemplary embodiment shown between the organic light-emitting layer 5 and the further electrode 7 and optionally a hole-blocking layer arranged between the organic light-emitting layer 5 and the electron-conducting layer 6.

Taking account of the conventional refractive index in the organic functional layer stack, it is particularly preferable for the optical length between the organic light-emitting layer 5 and the further electrode 7 to be greater than or equal to 1.6 times 20 nm and less than or equal to 1.8 times 100 nm at a wavelength of for example 600 nm. The distance between the organic light-emitting layer 5 and the further electrode 7 is greater than or equal to 30 nm and less than or equal to 60 nm. The advantage of such spacing between the organic light-emitting layer 5 and the further, preferably reflective electrode 7 is explained further below in connection with FIG. 2.

Furthermore, the organic light-emitting layer 5 comprises emitter molecules with an anisotropic molecular structure, which are anisotropically oriented. This means that the emitter molecules of the organic light-emitting layer 5 do not have a substantially spherical molecular structure but rather for example a more elongate molecular structure. To this end, the emitter molecules of anisotropic molecular structure comprise for example at least two different ligands, for example ligands which differ in terms of their atoms coordinating to a central atom, or comprise a square-planar central atom environment.

In the exemplary embodiment shown, the organic light-emitting layer 5 comprises a phosphorescent emitter material of anisotropic molecular structure which is selected from iridium complexes, platinum complexes, palladium complexes or from mixtures thereof. Alternatively or in addition, the organic light-emitting layer 5 may also comprise one or more of the other anisotropic emitter materials mentioned above in the general part of the description. The anisotropic emitter molecules may be embedded or contained in a matrix material of the organic light-emitting layer 5, which matrix material may have an isotropic or preferably likewise an anisotropic molecular structure and for example may comprise or consist of one or more of the matrix materials mentioned above in the general part of the description.

In the exemplary embodiment shown, the emitter molecules of the organic light-emitting layer 5 and in particular of the dipole moments thereof described above in the general part of the description are substantially, i.e. in a proportion greater than 66%, parallel oriented, in particular in a proportion greater than 66% parallel to the plane of extension of the organic light-emitting layer 5. The advantage of an emitter material oriented isotropically in this way or of the dipole moments is also explained further below in connection with FIG. 3.

FIG. 1B shows a further exemplary embodiment of an organic light-emitting device 101 which, in comparison with the exemplary embodiment of FIG. 1A, comprises a plurality of organic light-emitting layers arranged between the electrodes 3, 7 and of which the light-emitting layers 51, 52, 53 are shown by way of example. In this case, each of the organic light-emitting layers 51, 52, 53 comprises an emitter material with emitter molecules with an anisotropic molecular structure, which are each oriented anisotropically. Furthermore, all the light-emitting layers 51, 52, 53 are spaced from the further electrode 7 as described in relation to FIG. 1A. A "charge-generation layer" described above in the general part of the description may be arranged between in each case adjacent organic light-emitting layers 51, 52, 53.

As an alternative to the exemplary embodiments shown, a greater or lesser number of light-emitting layers is also possible, i.e. for example two, four or more light-emitting layers, wherein in such cases too all the light-emitting layers are spaced as described in relation to FIG. 1A from the reflective electrode 7 and comprise anisotropic emitter molecules with an anisotropic orientation of the dipole moments to the main plane of extension of the organic light-emitting layers.

he purposefully selected distances described in the exemplary embodiments in FIGS. 1A and 1B between the organic light-emitting layers 5, 51, 52, 53 and the further, preferably reflective electrode 7 together with the anisotropically arranged emitter molecules of the light-emitting layer 5, 51, 52, 53 may bring about a reduction in plasmon losses and optimisation in terms of the utilisation of microcavity effects. Together with the optical outcoupling layer 2, a marked increase in efficiency compared to known OLEDs may thus be brought about.

The spacing of the light-emitting layers 5, 51, 52, 53 is apparent in particular in connection with FIG. 2, which is based on a simulation of a conventional green-emitting OLED provided with a light-emitting layer and on a standard glass substrate without an optical outcoupling layer or other outcoupling measures. The light-emitting layer forming the basis of FIG. 2 comprises isotropically arranged emitter molecules.

FIG. 2 shows the relative proportions L of the outcoupling and loss channels of the light generated in the light-emitting layer as a function of the thickness D of the layer or layers arranged between the light-emitting layer and a reflective electrode, which corresponds to the distance between the reflective electrode and the light-emitting layer. The relative proportions shown of the outcoupling and loss channels should not here be understood to limit the exemplary embodiments described here and may vary depending on the structure of the individual components and the material selected therefor.

The region 21 indicates the relative proportion of the light which is outcoupled from the translucent substrate. The region 22 corresponds to the relative proportion of the light which is guided in the glass substrate by wave guidance. The region 23 indicates the relative proportion of the light which is lost by absorption in the organic layers, the translucent electrode and the substrate. The region 24 indicates the relative proportion of the light which is guided in the translucent electrode and the organic layers by wave guidance effects. The region 25 indicates the proportion which is lost through the incoupling of surface plasmons into the reflective electrode.

It should be noted that the relative proportion of the light 21 outcoupled from the substrate increases slightly from a value of D of approximately 20 nm, while in the main as the value of D increases the loss channel caused by plasmon incoupling, i.e. the region 25, decreases considerably, whereby the relative proportion of the light guided in the organic layers and translucent electrode rises.

Through the additional optical outcoupling layer 2 present in the case of the organic light-emitting device 100 described here, the proportion of the light which is guided in the translucent electrode 3 and the organic layers may in particular be outcoupled at least in part. The organic light-emitting layers 5, 51, 52, 53 are therefore, as explained in relation to FIGS. 1A and 1B, placed in the region of the maximum of the region 21 for values of D of between approximately 20 nm and approximately 100 nm, wherein through this arrangement an increased outcoupling efficiency is obtained for the light generated in the organic light-emitting layers, 5, 51, 52, 53.

In addition to the advantageous spatial arrangement of the organic light-emitting layers 5, 51, 52, 53, the latter comprise, as described above, the emitter molecules with the anisotropic molecular structure, which are anisotropically and particularly preferably parallel oriented, wherein in particular the dipole moments of the emitter molecules are oriented parallel or substantially parallel to the main plane of extension of the organic light-emitting layers 5, 51, 52, 53, allowing further suppression of losses due to plasmon excitations in the further electrode, as is also apparent from FIG. 3.

FIG. 3 shows a simulation of a conventional OLED as in FIG. 2, wherein the proportion F of dipole moments oriented in parallel is here considered. The relative proportions shown of the outcoupling and loss channels should not here be understood to limit the exemplary embodiments described here and may vary depending on the structure of the individual components and the material selected therefor.

The region 31 indicates the relative proportion of the light which is outcoupled from the translucent substrate. The region 32 corresponds to the relative proportion of the light which is guided in the glass substrate by wave guidance. The region 33 indicates the relative proportion of the light which is guided in the translucent electrode and the organic layers by wave guidance effects. The region 34 indicates the proportion which is lost through the incoupling of surface plasmons into the further reflective electrode.

The dashed vertical line indicates a relative proportion of parallel oriented dipole moments of ⅔ or approximately 66%, which corresponds to an isotropic distribution of the anisotropic emitter molecules. An increase in the parallel oriented proportion is thus achieved along the dashed arrow.

It should be noted that the plasmon loss channel indicated by the region 34 decreases as the anisotropic and in particular parallel arrangement of the dipole moments increases, such that, as has already been explained in relation to FIG. 2, the relative proportion of the directly outcoupled light, of the light in the glass substrate and of the light guided in the organic layers and translucent electrode increases simultaneously. The light output, emitted by the substrate 1, of the light generated in the organic light-emitting layers 5, 51, 52, 53 may be increased in comparison with known OLEDs with typically isotropically and non-directionally arranged emitter molecules in particular by the above-described outcoupling of at least part of this proportion by the optical outcoupling layer 2.

The purposefully selected and optimised structure of the organic light-emitting device described here, in particular with regard to the arrangement of the light-emitting layers and their emitter materials, thus results in a marked increase in efficiency and improvement in light outcoupling. It is additionally possible to keep the total thickness of the organic light-emitting devices 100, 101 shown here very small as a result of the small distance between the light-emitting layers 5, 51, 52, 53 and the further, preferably reflective electrode 7.

The description made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. Organic light-emitting device, comprising:
   a translucent substrate, on which a translucent electrode is arranged,
   an organic functional layer stack on the translucent electrode with organic functional layers comprising at least one organic light-emitting layer, and
   a further electrode thereabove,
       wherein the at least one organic light-emitting layer comprises emitter molecules with an anisotropic molecular structure, which are anisotropically oriented,
       wherein the anisotropically oriented emitter molecules have transition dipole moments which are oriented in a proportion of more than 66% parallel to the main plane of extension of the at least one organic light-emitting layer,
       wherein all the organic light-emitting layers of the organic light-emitting device are at a distance of greater than or equal to 30 nm and less than or equal to 60 nm from the further electrode,
       wherein an optical outcoupling layer is arranged on a side of the translucent electrode remote from the at least one light-emitting layer,
       wherein the organic functional layer stack comprises at least one organic functional layer which is thicker than 5 nm and which has an absorbance coefficient k of less than or equal to 0.005 for part of the visible spectral range, and
       wherein the organic functional layer stack comprises a hole-conducting layer which has a thickness of greater than or equal to 5 nm and less than or equal to 350 nm and an absorbance coefficient k of less than or equal to 0.005 for part of the visible spectral range.

2. Device according to claim 1, wherein the optical outcoupling layer has a refractive index which is greater than or equal to a layer thickness-weighted average refractive index of the organic functional layers and the translucent electrode.

3. Device according to claim 1, wherein the optical outcoupling layer is light-scattering.

4. Device according to claim 1, wherein the at least one organic light-emitting layer comprises a plurality of organic light-emitting layers.

5. Device according to claim 1, wherein the at least one organic light-emitting layer comprises a matrix material, in which the anisotropically oriented emitter molecules are arranged.

6. Device according to claim 5, wherein the matrix material of the at least one organic light-emitting layer has an anisotropic molecular structure.

7. Device according to claim 1, wherein the further electrode is reflective.

8. Device according to claim 7, wherein the reflective further electrode has a reflectivity of greater than or equal to 80% in the visible spectral range.

9. Device according to claim 1, wherein the translucent electrode has an absorbance coefficient k of less than or equal to 0.005 for part of the visible spectral range and a total transmission in the visible spectral range of greater than or equal to 80%.

10. Organic light-emitting device, comprising
    a translucent substrate, on which a translucent electrode is arranged,
    an organic functional layer stack on the translucent electrode with organic functional layers comprising at least one organic light-emitting layer, and a further electrode thereabove,
   wherein the at least one organic light-emitting layer comprises emitter molecules with an anisotropic molecular structure, which are anisotropically oriented,
   wherein the anisotropically oriented emitter molecules have transition dipole moments which are oriented in a proportion of more than 66% parallel to the main plane of extension of the at least one organic light-emitting layer,
   wherein an optical outcoupling layer is arranged on the side of the translucent electrode remote from the at least one light-emitting layer, and
   wherein all the organic light-emitting layers of the organic light-emitting component are at a distance of greater than or equal to 30 nm and less than 70 nm from the further electrode,
   wherein the organic functional layer stack comprises at least one organic functional layer which is thicker than 5 nm and which has an absorbance coefficient k of less than or equal to 0.005 for part of the visible spectral range.

* * * * *